(12) United States Patent
Yoshimura et al.

(10) Patent No.: US 9,793,344 B2
(45) Date of Patent: Oct. 17, 2017

(54) SEMICONDUCTOR DEVICE AND METHOD OF MANUFACTURING THE SAME

(71) Applicant: Kabushiki Kaisha Toshiba, Minato-ku, Tokyo (JP)

(72) Inventors: Naoya Yoshimura, Kanazawa Ishikawa (JP); Hideaki Ninomiya, Nomi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/002,198

(22) Filed: Jan. 20, 2016

(65) Prior Publication Data

US 2017/0062555 A1    Mar. 2, 2017

(30) Foreign Application Priority Data

Aug. 31, 2015  (JP) .................................. 2015-170712

(51) Int. Cl.
| | |
|---|---|
| *H01L 29/06* | (2006.01) |
| *H01L 29/66* | (2006.01) |
| *H01L 29/423* | (2006.01) |
| *H01L 29/739* | (2006.01) |
| *H01L 21/66* | (2006.01) |
| *H01L 29/78* | (2006.01) |
| *H01L 29/40* | (2006.01) |

(52) U.S. Cl.
CPC .......... *H01L 29/0619* (2013.01); *H01L 22/10* (2013.01); *H01L 29/66348* (2013.01); *H01L 29/7397* (2013.01); *H01L 29/7813* (2013.01); *H01L 29/407* (2013.01); *H01L 29/4236* (2013.01)

(58) Field of Classification Search
None
See application file for complete search history.

(56) References Cited

U.S. PATENT DOCUMENTS

2016/0211257 A1*  7/2016  Yoshida ............ H01L 29/42368

FOREIGN PATENT DOCUMENTS

| JP | 4815861 B2 | 11/2011 |
|---|---|---|
| JP | 2013-153220 A | 8/2013 |
| JP | 5444731 B2 | 3/2014 |

* cited by examiner

*Primary Examiner* — Whitney T Moore
(74) *Attorney, Agent, or Firm* — White & Case LLP (57) ABSTRACT

According to one embodiment, a semiconductor device comprises a first semiconductor region of a first conductivity type, a second semiconductor region of a second conductivity type, a third semiconductor region of the first conductivity type, a gate electrode, a gate insulating layer, a fourth semiconductor region of the second conductivity type, a first conductive unit and a first insulating layer. The fourth semiconductor region is provided selectively on the first semiconductor region. The fourth semiconductor region is separated from the second semiconductor region. At least a portion of the first conductive unit is surrounded with the fourth semiconductor region. At least a portion of the first insulating layer is provided between the first conductive unit and the fourth semiconductor region. A thickness of a portion of the first insulating layer is thinner than a film thickness of the gate insulating layer.

14 Claims, 11 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from Japanese Patent Application No. 2015-170712, filed on Aug. 31, 2015; the entire contents of which are incorporated herein by reference.

FIELD

Embodiments described herein relate generally to a semiconductor device and a method of manufacturing the same.

BACKGROUND

There are cases where it is necessary to check for the occurrence of defects of a gate insulating layer in a semiconductor device such as a MOSFET (Metal Oxide Semiconductor Field Effect Transistor), an IGBT (Insulated Gate Bipolar Transistor), or the like. It is desirable for the detection precision of the defects to be high.

BRIEF DESCRIPTION OF THE DRAWINGS

FIG. 3A to FIG. 5B are cross-sectional views of processes, showing manufacturing processes of the semiconductor device according to the first embodiment;

DETAILED DESCRIPTION

According to one embodiment, a semiconductor device comprises a first semiconductor region of a first conductivity type, a second semiconductor region of a second conductivity type, a third semiconductor region of the first conductivity type, a gate electrode, a gate insulating layer, a fourth semiconductor region of the second conductivity type, a first conductive unit and a first insulating layer. The second semiconductor region is provided selectively on the first semiconductor region. The third semiconductor region is provided selectively on the second semiconductor region. The gate electrode is arranged with the second semiconductor region in a second direction. The second direction is perpendicular to a first direction from the first semiconductor region toward the second semiconductor region. The gate insulating layer is provided between the gate electrode and the first semiconductor region, between the gate electrode and the second semiconductor region, and between the gate electrode and the third semiconductor region. The fourth semiconductor region is provided selectively on the first semiconductor region. The fourth semiconductor region is separated from the second semiconductor region. At least a portion of the first conductive unit is surrounded with the fourth semiconductor region. At least a portion of the first insulating layer is provided between the first conductive unit and the fourth semiconductor region. A thickness of a portion of the first insulating layer positioned between the first conductive unit and the first semiconductor region in the first direction is thinner than a film thickness of the gate insulating layer.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

An XYZ orthogonal coordinate system is used in the description of the embodiments. A direction from an $n^-$-type semiconductor region 1 toward an p-type base region 2 is taken as a Z-direction (a first direction); and two mutually-orthogonal directions perpendicular to the Z-direction are taken as an X-direction (a second direction) and a Y-direction (a third direction).

In the following description, the notations of $n^+$, $n^-$, $p^+$, and p indicate relative levels of the impurity concentrations of the conductivity types. Namely, $n^+$ indicates that the n-type impurity concentration is relatively higher than that of $n^-$, $p^+$ indicates that the p-type impurity concentration is relatively higher than that of p.

The embodiments described below may be implemented by reversing the p-type and the n-type of the semiconductor regions.

First Embodiment

An example of a semiconductor device according to a first embodiment will now be described using FIG. 1 and FIG. 2.

Figure 1:
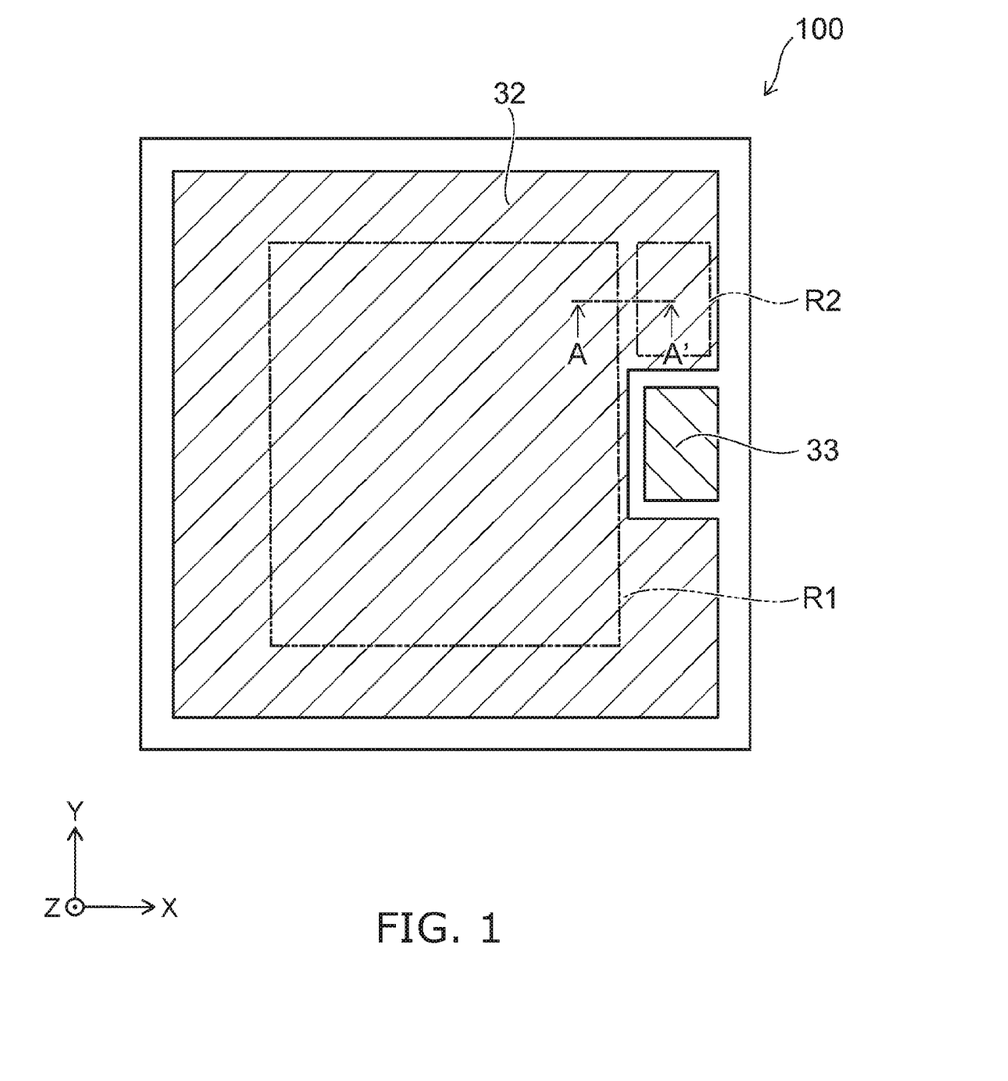
FIG. 1 is a plan view showing the semiconductor device according to the first embodiment.

FIG. 1 is a plan view showing the semiconductor device 100 according to the first embodiment.

Figure 2:
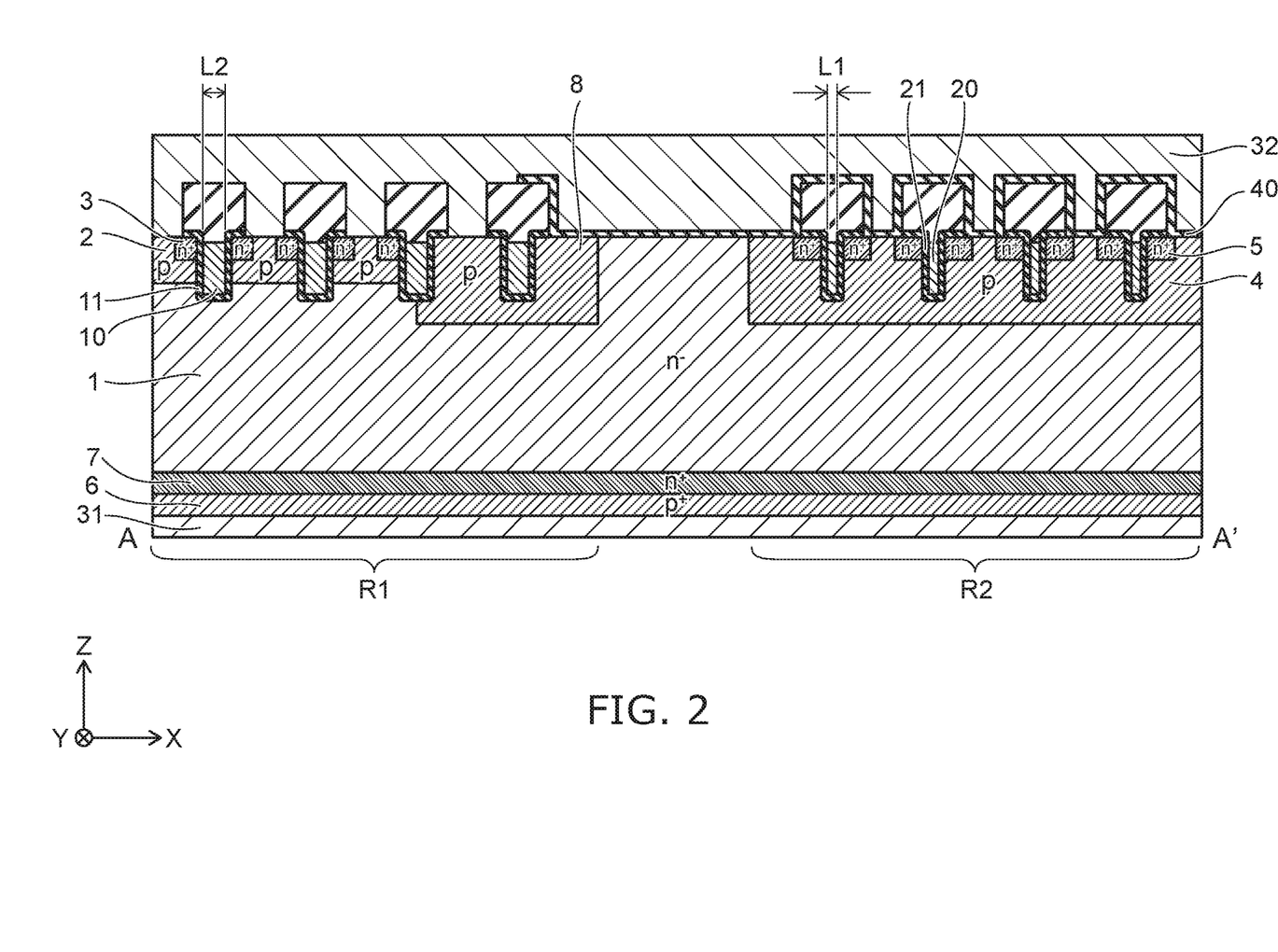
FIG. 2 is an A-A' cross-sectional view of FIG. 1.

FIG. 2 is an A-A' cross-sectional view of FIG. 1.

A main element region R1 and a test element region R2 are illustrated by broken lines in FIG. 1.

The semiconductor device 100 is, for example, an IGBT.

As shown in FIG. 1 and FIG. 2, the semiconductor device 100 includes a $p^+$-type (a second conductivity type) collector region 6 (a sixth semiconductor region), an $n^+$-type (a first conductivity type) semiconductor region 7 (a seventh semiconductor region), an $n^-$-type semiconductor region 1 (a first semiconductor region), a p-type base region 2 (a second semiconductor region), an $n^+$-type emitter region 3 (a third semiconductor region), a p-type semiconductor region 4 (a fourth semiconductor region), an $n^+$-type semiconductor region 5 (a fifth semiconductor region), a p-type semiconductor region 8 (an eighth semiconductor region), a gate electrode 10, a gate insulating layer 11, a first conductive unit 20, a first insulating layer 21, a collector electrode 31, an emitter electrode 32, and a gate electrode pad 33.

As shown in FIG. 1, the emitter electrode 32 and the gate electrode pad 33 are provided to be separated from each other on the upper surface of the semiconductor device 100. The main element region R1 and the test element region R2 are provided to be separated from each other in the semiconductor device 100. The emitter electrode 32 is provided in the main element region R1 and the test element region R2.

As shown in FIG. 2, the collector electrode 31 is provided on the lower surface of the semiconductor device.

The $p^+$-type collector region 6 is provided on the collector electrode 31 and is electrically connected to the collector electrode 31.

The $n^1$-type semiconductor region 7 is provided on the $p^+$-type collector region 6. The $n^-$-type semiconductor region 1 is provided on the $n^-$-type semiconductor region 7.

The collector electrode 31, the $p^+$-type collector region 6, the $n^+$-type semiconductor region 7, and the $n^-$-type semiconductor region 1 are provided in both the main element region R1 and the test element region R2.

The p-type base region 2 is provided on the $n^-$-type semiconductor region 1 in the main element region R1.

The $n^+$-type emitter region 3 is provided selectively on the p-type base region 2. The p-type base region 2 and the $n^+$-type emitter region 3 are multiply provided in the X-direction; and the p-type base regions 2 and the $n^+$-type emitter regions 3 extend in the Y-direction.

The p-type semiconductor region 8 is provided around the multiple p-type base regions 2.

The p-type base region 2, the $n^+$-type emitter region 3, and the p-type semiconductor region 8 are electrically connected to the emitter electrode 32 provided on the p-type base region 2, the $n^+$-type emitter region 3, and the p-type semiconductor region 8.

The gate electrode 10 is provided in the main element region R1 and opposes, with the gate insulating layer 11 interposed, the p-type base region 2. The gate electrode 10 includes a portion surrounded with the $n^-$-type semiconductor region 1 with the gate insulating layer 11 interposed. An insulating layer is provided between the gate electrode 10 and the emitter electrode 32; and these electrodes are electrically isolated.

The gate electrode 10 is multiply provided in the X-direction; and each of the gate electrodes 10 extends in the Y-direction.

The p-type semiconductor region 4 is provided in the test element region R2. For example, the thickness in the Z-direction of the p-type semiconductor region 4 is thicker than the thickness in the Z-direction of the p-type base region 2.

The $n^+$-type semiconductor region 5 is provided selectively on the p-type semiconductor region 4. However, the semiconductor device 100 may not include the $n^+$-type semiconductor region 5.

The first conductive unit 20 is surrounded with the p-type semiconductor region 4 with the first insulating layer 21 interposed. For example, the first conductive unit 20 is multiply provided in the X-direction. Dielectric breakdown of the first insulating layer 21 between the p-type semiconductor region 4 and at least one of the first conductive units 20 has occurred. Therefore, conduction occurs between the one of the first conductive units 20 and the p-type semiconductor region 4.

Or, a portion of the first conductive unit 20 may be surrounded with the p-type semiconductor region 4 with the first insulating layer 21 interposed; and one other portion of the first conductive unit 20 may be surrounded with the $n^-$-type semiconductor region 1 with the first insulating layer 21 interposed. In such a case, conduction occurs between at least one of the first conductive units 20 and the $n^-$-type semiconductor region 1 or the p-type semiconductor region 4.

A length L1 in the X-direction of the first conductive unit 20 is shorter than a length L2 in the X-direction of the gate electrode 10. The thickness of the portion of the first insulating layer 21 positioned between the first conductive unit 20 and the $n^-$-type semiconductor region 1 in the Z-direction is thinner than the thickness of the portion of the gate insulating layer 11 positioned between the gate electrode 10 and the $n^-$-type semiconductor region 1 in the Z-direction.

An insulating layer 40 is provided from the upper surface of a portion of the p-type semiconductor region 8 over the upper surface of the p-type semiconductor region 4. The emitter electrode 32 is provided on the insulating layer 40 in the test element region R2.

In the case where the first conductive unit 20 does not pierce the p-type semiconductor region 4 and does not reach the $n^-$-type semiconductor region 1, the p-type semiconductor region 4 and the $n^+$-type semiconductor region 5 may not be covered with the insulating layer 40; and these semiconductor regions may contact the emitter electrode 32.

On the other hand, in the case where the first conductive unit 20 pierces the p-type semiconductor region 4 and reaches the $n^-$-type semiconductor region 1, it is desirable for the p-type semiconductor region 4 and the $n^+$-type semiconductor region 5 to be covered with the insulating layer 40 and not to directly contact the emitter electrode 32. Or, in such a case, it is desirable for the $n^+$-type semiconductor region 5 not to be provided on the p-type semiconductor region 4.

Examples of the materials of the components will now be described.

The $p^+$-type collector region 6, the $n^+$-type semiconductor region 7, the $n^-$-type semiconductor region 1, the p-type base region 2, the $n^+$-type emitter region 3, the p-type semiconductor region 4, the $n^+$-type semiconductor region 5, and the p-type semiconductor region 8 include silicon, silicon carbide, gallium nitride, or gallium arsenide.

The gate electrode 10 and the first conductive unit 20 include a conductive material such as polysilicon, etc.

The gate insulating layer 11 and the first insulating layer 21 include an insulating material such as silicon oxide, etc.

The collector electrode 31, the emitter electrode 32, and the gate electrode pad 33 include a metal such as aluminum, etc.

An example of a method for manufacturing the semiconductor device according to the first embodiment will now be described with reference to FIG. 3A to FIG. 6.

FIG. 3A to FIG. 5B are cross-sectional views of processes, showing manufacturing processes of the semiconductor device 100 according to the first embodiment.

Figure 6:
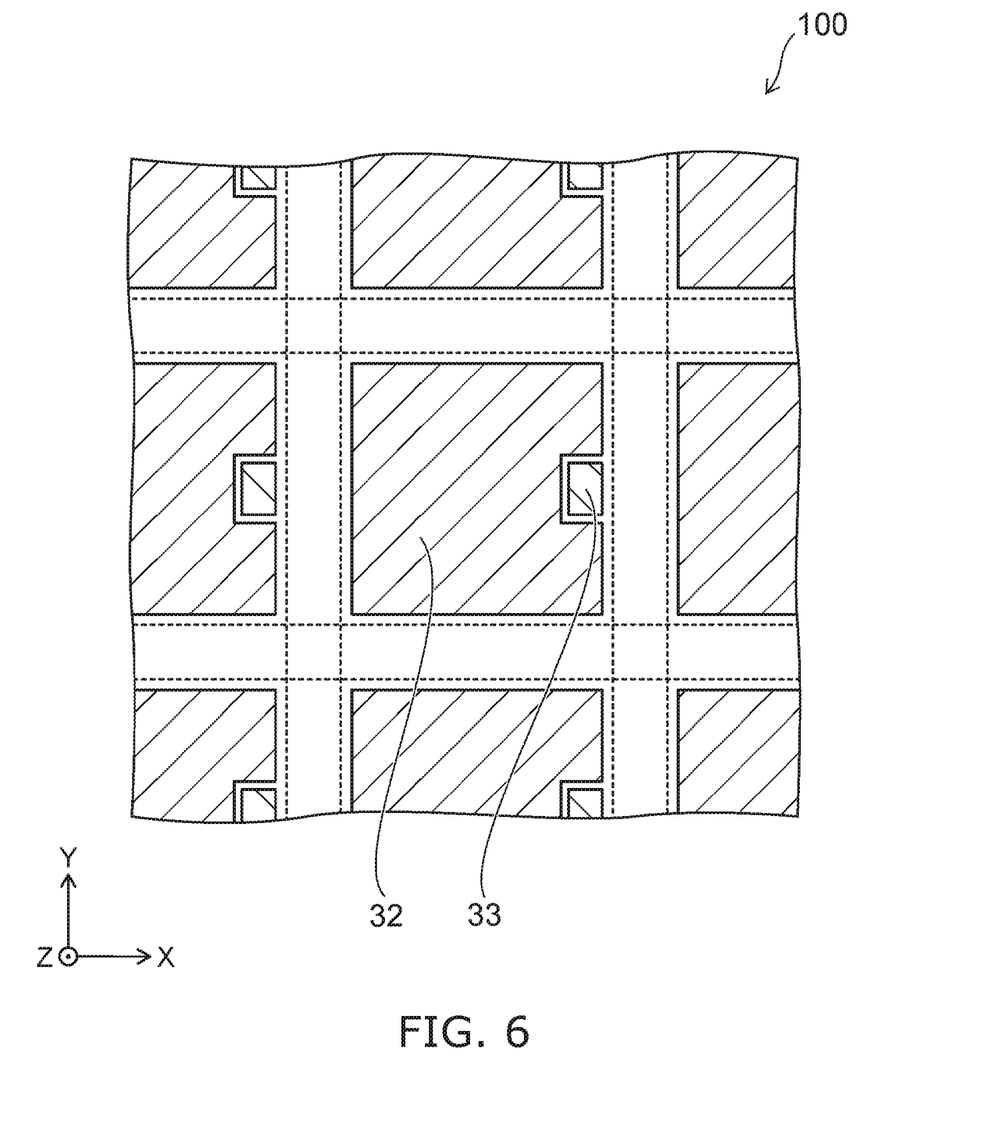
FIG. 6 is a process plan view showing a manufacturing process of the semiconductor device according to the first embodiment.

FIG. 6 is a process plan view showing a manufacturing process of the semiconductor device 100 according to the first embodiment.

Figure 3A:
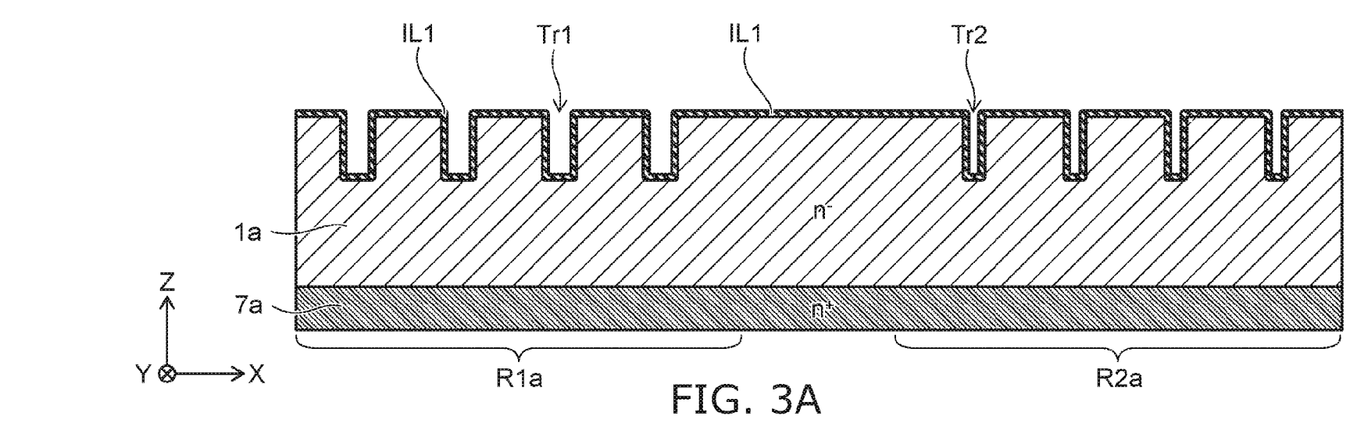

First, a semiconductor substrate that includes an $n^+$-type semiconductor layer 7a (a first semiconductor layer) and an $n^-$-type semiconductor layer 1a (a second semiconductor layer) provided on the $n^+$-type semiconductor layer 7a is prepared. The $n^-$-type semiconductor layer 1a includes a first region R1a that corresponds to the main element region R1 and a second region R2a that corresponds to the test element region R2.

Continuing, multiple first trenches Tr1 are made in the surface of the first region R1a; and multiple second trenches Tr2 are made in the surface of the second region R2a. The first trenches Tr1 and the second trenches Tr2 are multiply made in the X-direction; and each of the first trenches Tr1 and second trenches Tr2 extends in the V-direction. At this time, the first trenches Tr1 and the second trenches Tr2 are made so that the width (the length in the X-direction) of the second trench Tr2 is narrower (shorter) than the width (the length in the X-direction) of the first trench Tr1. The first trenches Tr1 and the second trenches Tr2 may be made by mutually-different processes.

Then, a first insulating layer IL1 is formed on the inner walls of these trenches and the upper surface of the $n^-$-type semiconductor layer 1a as shown in FIG. 3A by performing thermal oxidation. At this time, the width of the second trench Tr2 is narrower than the width of the first trench Tr1. Therefore, the oxide film forms less easily at the bottom portion of the second trench Tr2 than at the bottom portion of the first trench Tr1. As a result, the thickness of the portion of the first insulating layer IL1 formed at the bottom portion of the second trench Tr2 is thinner than the thickness of the portion of the first insulating layer IL1 formed at the bottom portion of the first trench Tr1.

Figure 3B:
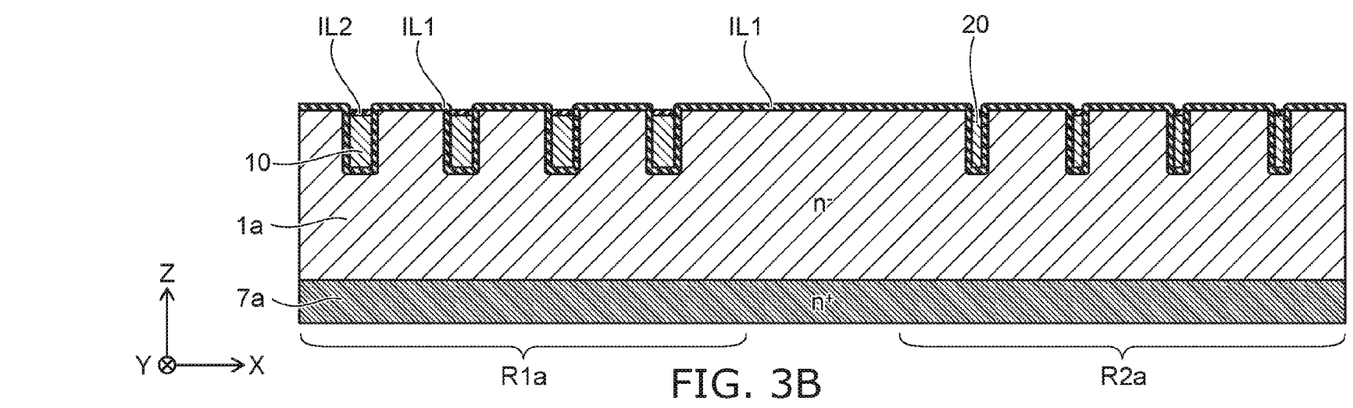

Then, a first conductive layer is formed on the first insulating layer IL1; and a portion of the first conductive layer is removed by etching. By this process, the gate electrodes 10 are formed in the interiors of the first trenches Tr1; and the first conductive units 20 are formed in the interiors of the second trenches Tr2. Continuing as shown in FIG. 3B, a second insulating layer IL2 is formed by oxidizing the upper surfaces of the gate electrodes 10 and the upper surfaces of the first conductive units 20.

Then, the p-type base region 2 and the p-type semiconductor region 8 are formed by ion-implanting a p-type impurity into the surface of the first region R1a; and the p-type semiconductor region 4 is formed by ion-implanting a p-type impurity into the surface of the second region R2a. The p-type base region 2, the p-type semiconductor region 4, and the p-type semiconductor region 8 may be formed simultaneously in the same process or may be formed in mutually-different processes.

Figure 4A:
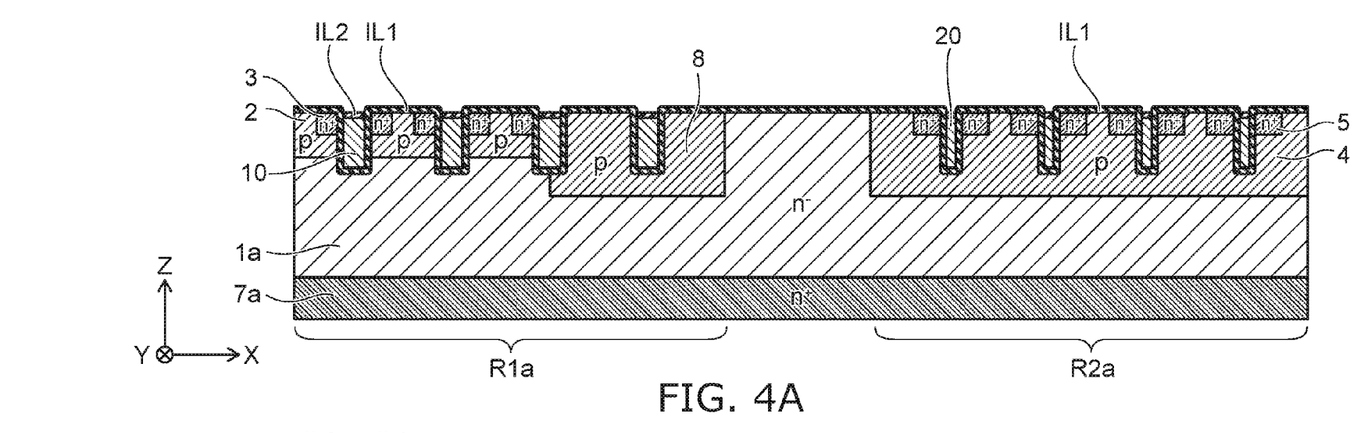

Continuing as shown in FIG. 4A, the $n^+$-type emitter region 3 is formed selectively by ion-implanting an n-type impurity into the surface of the p-type base region 2. At this time, the $n^+$-type semiconductor region 5 may be formed on the p-type semiconductor region 4.

Here, a test of the semiconductor device is performed partway through the manufacturing.

Specifically, first, a prescribed voltage is applied between the $n^+$-type semiconductor layer 7a and the first conductive units 20. Continuing, as the applied voltage is increased, dielectric breakdown of the first insulating layer IL1 corresponding to one of the first insulating layers 21 occurs; and the first conductive unit 20 is shorted to the p-type semiconductor region 4. At this time, the voltage at which the dielectric breakdown of the first insulating layer 21 occurred is recorded.

Continuing, the voltage at which the dielectric breakdown of the first insulating layer 21 occurred is applied between the $n^+$-type semiconductor layer 7a and the gate electrodes 10. As described above, the thickness of the portion of the first insulating layer IL1, formed at the bottom portion of the second trench Tr2 is thinner than the thickness of the portion of the first insulating layer IL1 formed at the bottom portion of the first trench Tr1. Therefore, if the first trench Tr1 and the gate insulating layer 11 are formed as designed, dielectric breakdown of the gate insulating layer 11 does not occur at the voltage at which the dielectric breakdown occurred in the first insulating layer 21.

Figure 4B:
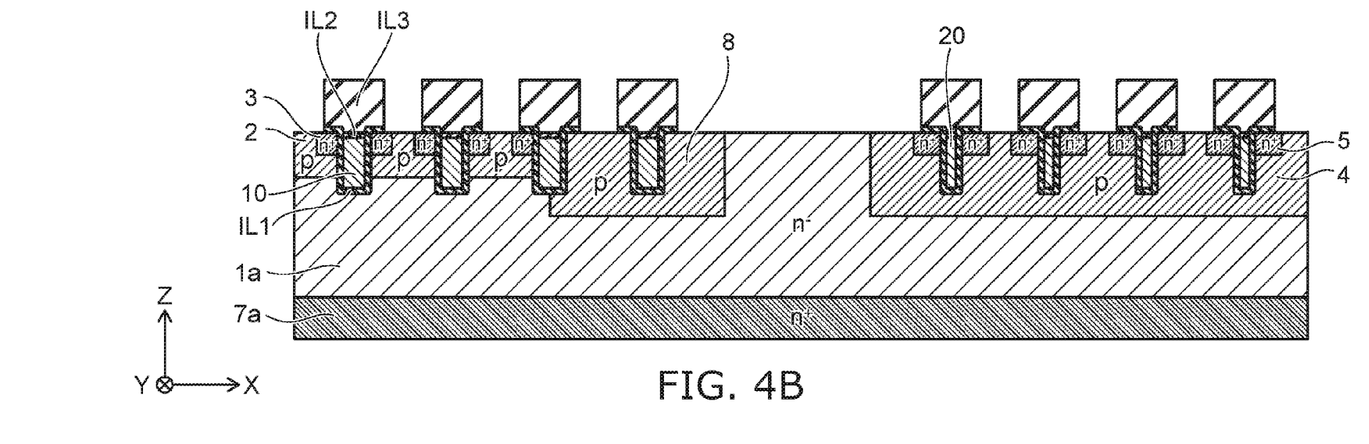

After performing the test, a third insulating layer IL3 is formed on the first insulating layer IL1 and the second insulating layer IL2. Continuing, the first to third insulating layers IL1 to IL3 are patterned; and the surfaces of the p-type base region 2, the $n^+$-type emitter region 3, the p-type semiconductor region 8, and the p-type semiconductor region 4 are exposed as shown in FIG. 4B.

Figure 5A:
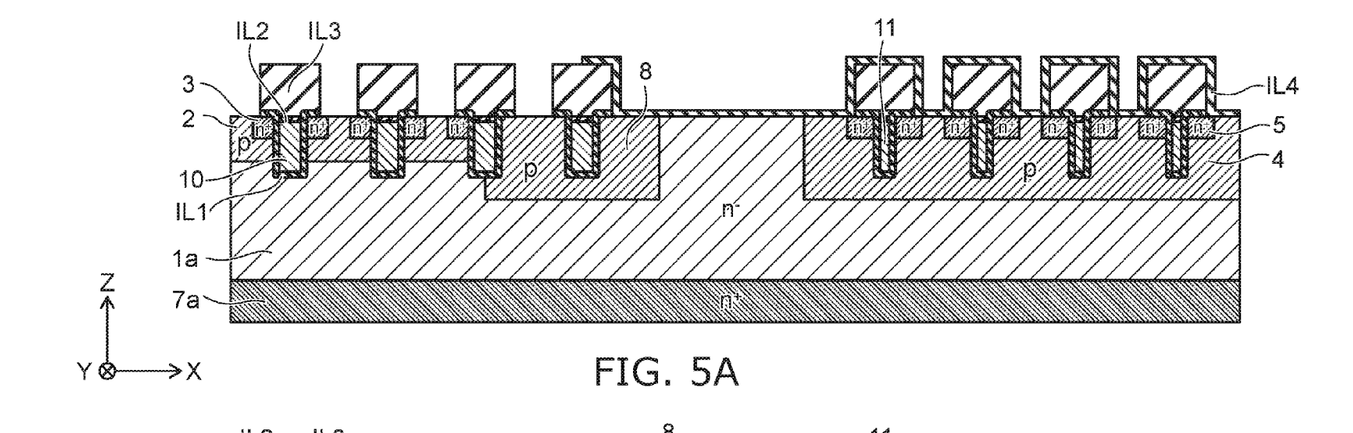

Then, a fourth insulating layer IL4 that covers the exposed semiconductor regions and the patterned third insulating layer IL3 is formed. Continuing as shown in FIG. 5A, the fourth insulating layer IL4 is patterned; and the surfaces of the $n^+$-type emitter region 3, the p-type base region 2, and a portion of the p-type semiconductor region 8 in the first region R1a are exposed again.

Then, a metal layer that covers the exposed semiconductor regions and the patterned fourth insulating layer IL4 is formed. Continuing, the emitter electrode 32 and the gate electrode pad 33 are formed by patterning the metal layer.

Figure 5B:
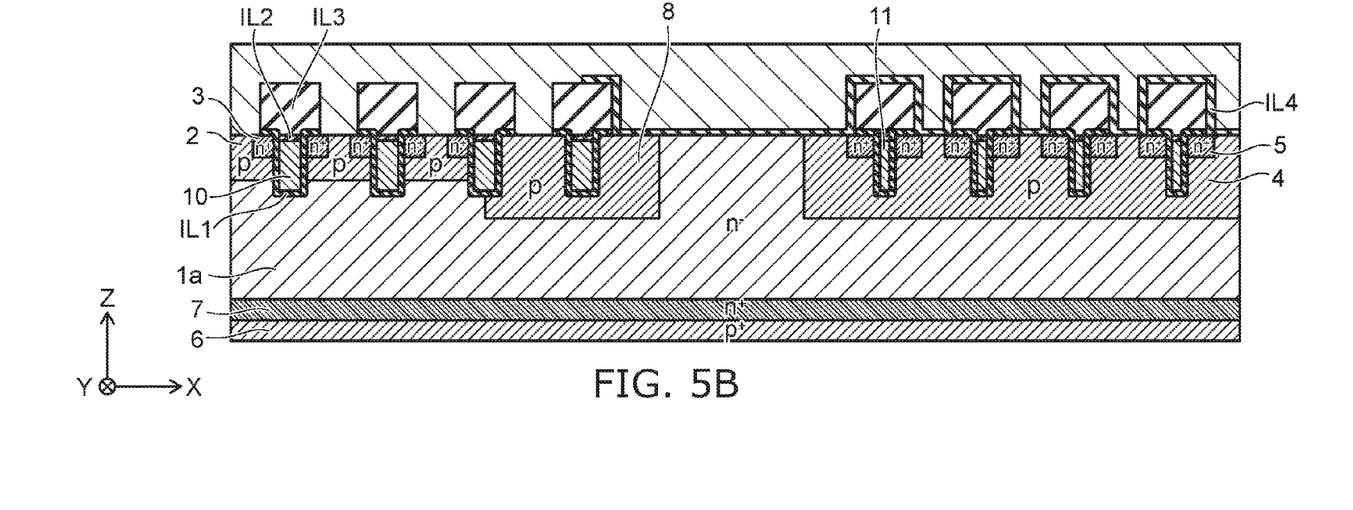

Then, the back surface of the $n^+$-type semiconductor layer 7a is polished until the $n^+$-type semiconductor layer 7a has a prescribed thickness. Continuing, the $p^+$-type collector region 6 is formed as shown in FIG. 5B by ion-implanting a p-type impurity into the back surface of the $n^+$-type semiconductor layer 7a. Subsequently, the collector electrode 31 is formed under the $p^+$-type collector region 6.

At this time, the multiple semiconductor devices 100 are formed in the semiconductor substrate as shown in FIG. 6. The semiconductor device 100 shown in FIG. 1 and FIG. 2 is obtained by separating the semiconductor devices 100 by dicing the semiconductor substrate at the positions of the broken lines shown in FIG. 6.

Operations and effects of the embodiment will now be described.

Other than the gate electrode 10 and the gate insulating layer 11, the semiconductor device 100 according to the embodiment includes the first conductive unit 20 and the first insulating layer 21 for testing. As described above, the insulation breakdown voltage of the first insulating layer 21 is lower than the insulation breakdown voltage of the gate insulating layer 11 because the film thickness of the bottom portion of the first insulating layer 21 is thinner than the film thickness of the bottom portion of the gate insulating layer 11.

Accordingly, in the case where there are no defects in the gate insulating layer 11, dielectric breakdown does not occur in the gate insulating layer 11 when the voltage at which the dielectric breakdown of the first insulating layer 21 occurred is applied to the gate insulating layer 11.

According to the embodiment, the voltage for testing the gate insulating layer 11 can be determined using the first insulating layer 21 provided inside the same semiconductor device as the gate insulating layer 11. In other words, even in the case where characteristic fluctuation occurs between semiconductor devices or substrates, the voltage for performing the test can be changed according to the characteristic fluctuation. Therefore, in the case where there are defects in the gate insulating layer 11, the detection precision of the defects can be increased. Even in the case where the breakdown voltage of the gate insulating layer 11 is lower than the median value due to the fluctuation of the characteristics, etc., the gate insulating layer 11 can be tested at a voltage corresponding to the fluctuation. Therefore, it is also possible to increase the yield by reducing the likelihood of causing breakdown of a normal gate insulating layer 11.

Modification

A semiconductor device according to a modification of the first embodiment will now be described using FIG. 7 and FIGS. 8A and 8B.

Figure 7:
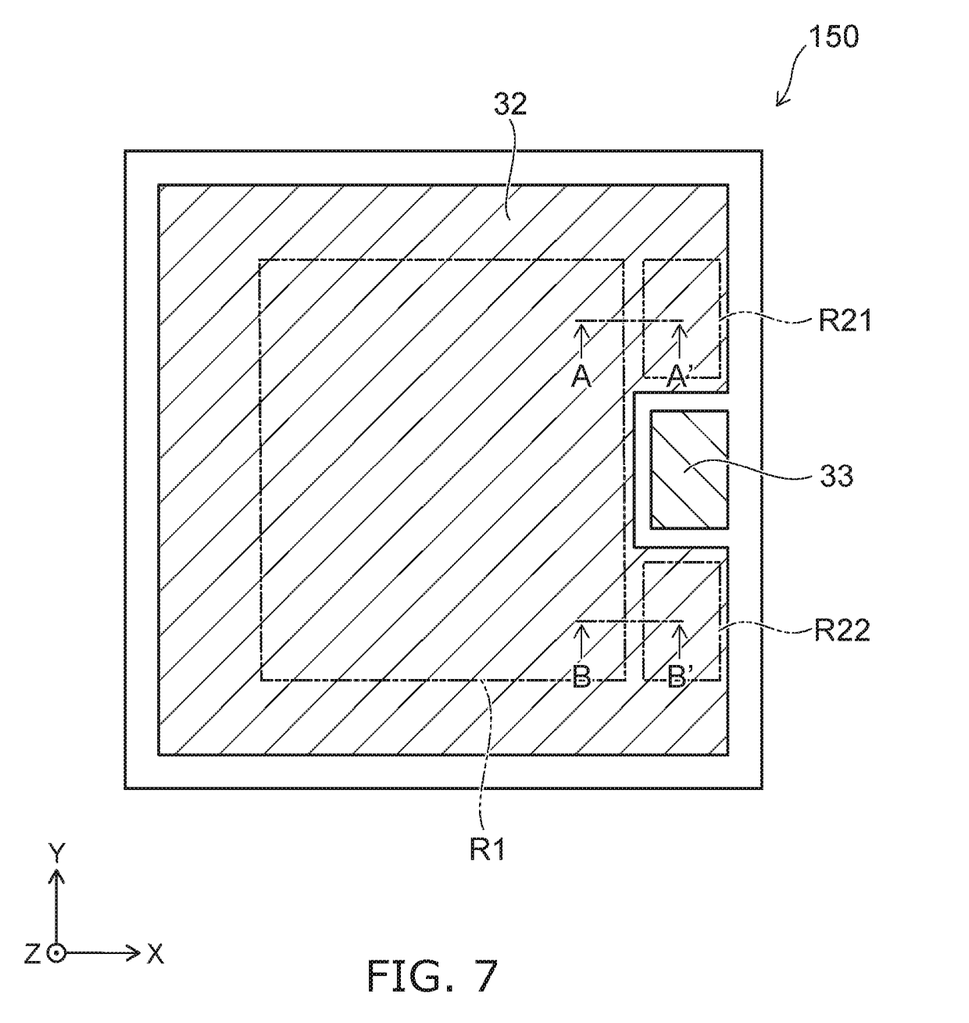
FIG. 7 is a plan view showing the semiconductor device according to the modification of the first embodiment.

FIG. 7 is a plan view showing the semiconductor device 150 according to the modification of the first embodiment.

Figure 8A:
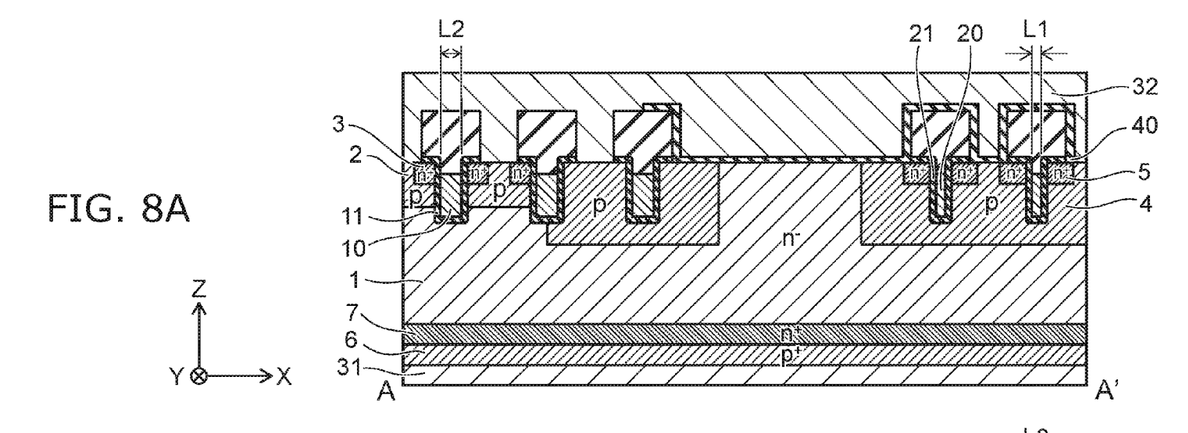
FIG. 8A is an A-A' cross-sectional view of FIG. 7
Figure 8B:
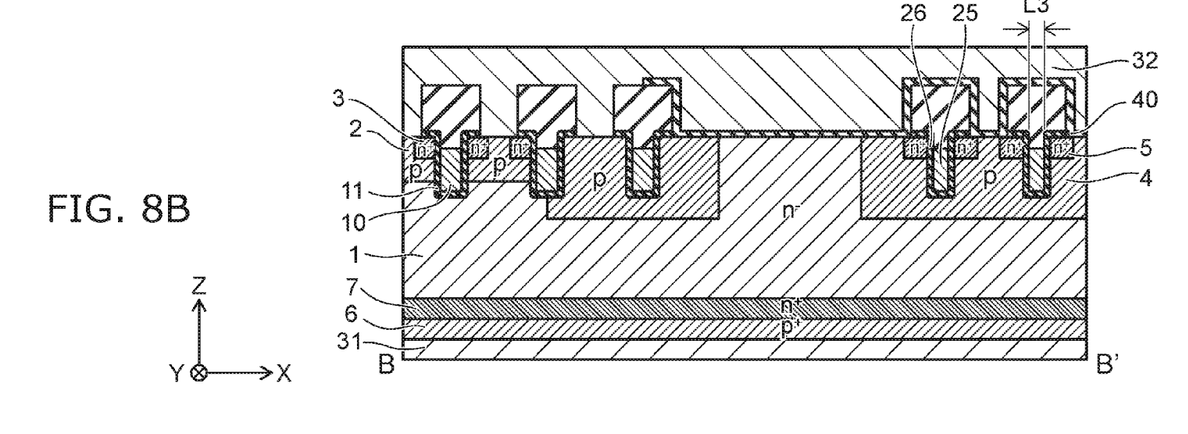
FIG. 8B is a B-B' cross-sectional view of FIG. 7.

FIG. 8A is an A-A' cross-sectional view of FIG. 7; and FIG. 8B is a B-B' cross-sectional view of FIG. 7.

The semiconductor device 150 includes the main element region R1, a first test element region R21, and a second test element region R22.

A second conductive unit 25 and a second insulating layer 26 are provided in the second test element region R22 as shown in FIG. 8B. Similarly to the first conductive unit 20, the second conductive unit 25 is surrounded with the p-type semiconductor region 4 with the first insulating layer 21 interposed.

A length L3 in the X-direction of the second conductive unit 25 is longer than the length L1 of the first conductive unit 20 and shorter than the length L2 of the gate electrode 10. However, the length L3 may be equal to the length L1. The film thickness of the bottom portion of the second insulating layer 26 is thicker than the film thickness of the bottom portion of the first insulating layer 21 and thinner than the film thickness of the bottom portion of the gate insulating layer 11. Accordingly, the insulation breakdown voltage of the second insulating layer 26 is higher than the insulation breakdown voltage of the first insulating layer 21 and lower than the insulation breakdown voltage of the gate insulating layer 11.

The semiconductor device 150 according to the modification includes the second conductive unit 25 and the second insulating layer 26 in addition to the first conductive unit 20 and the first insulating layer 21. By applying a voltage to the first insulating layer 21 and confirming the breakdown voltage of the first insulating layer 21 and by applying a voltage to the second insulating layer 26 and confirming the breakdown voltage of the second insulating layer 26, it is possible to confirm whether or not the conductive units and insulating layers for testing are formed as designed.

For example, if the breakdown voltage of the second insulating layer 26 is lower than the breakdown voltage of the first insulating layer 21, it can be known that the second insulating layer 26 is not formed as designed and that there is a high possibility that the first insulating layer 21 is formed as designed.

By determining the voltage for performing the test of the gate insulating layer 11 by using the elements formed in both the first test element region R21 and the second test element region R22, the detection precision of the defects of the gate insulating layer 11 can be increased even more.

Second Embodiment

A semiconductor substrate according to a second embodiment will now be described using FIG. 9 to FIG. 11.

Figure 9:
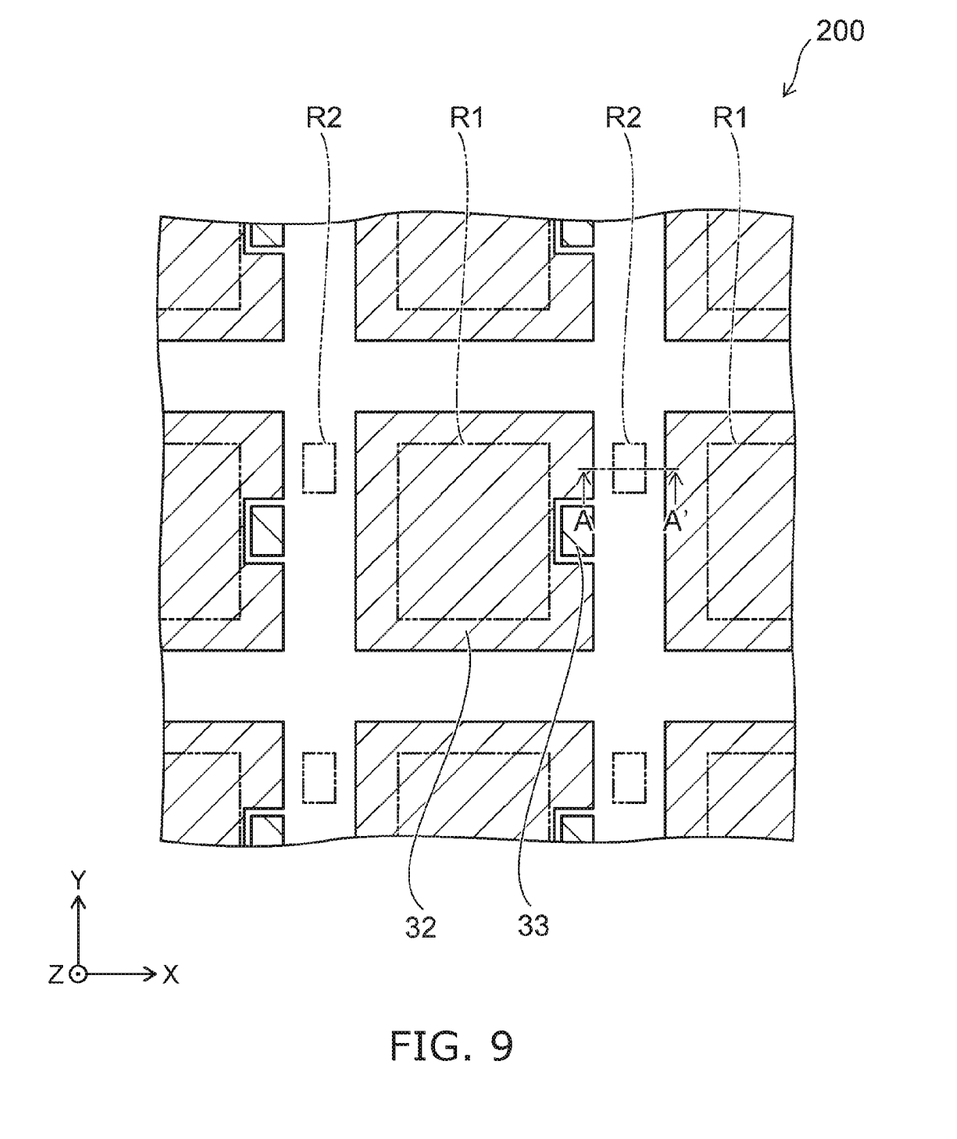
FIG. 9 is a plan view showing the semiconductor substrate according to the second embodiment.

FIG. 9 is a plan view showing the semiconductor substrate 200 according to the second embodiment.

Figure 10:
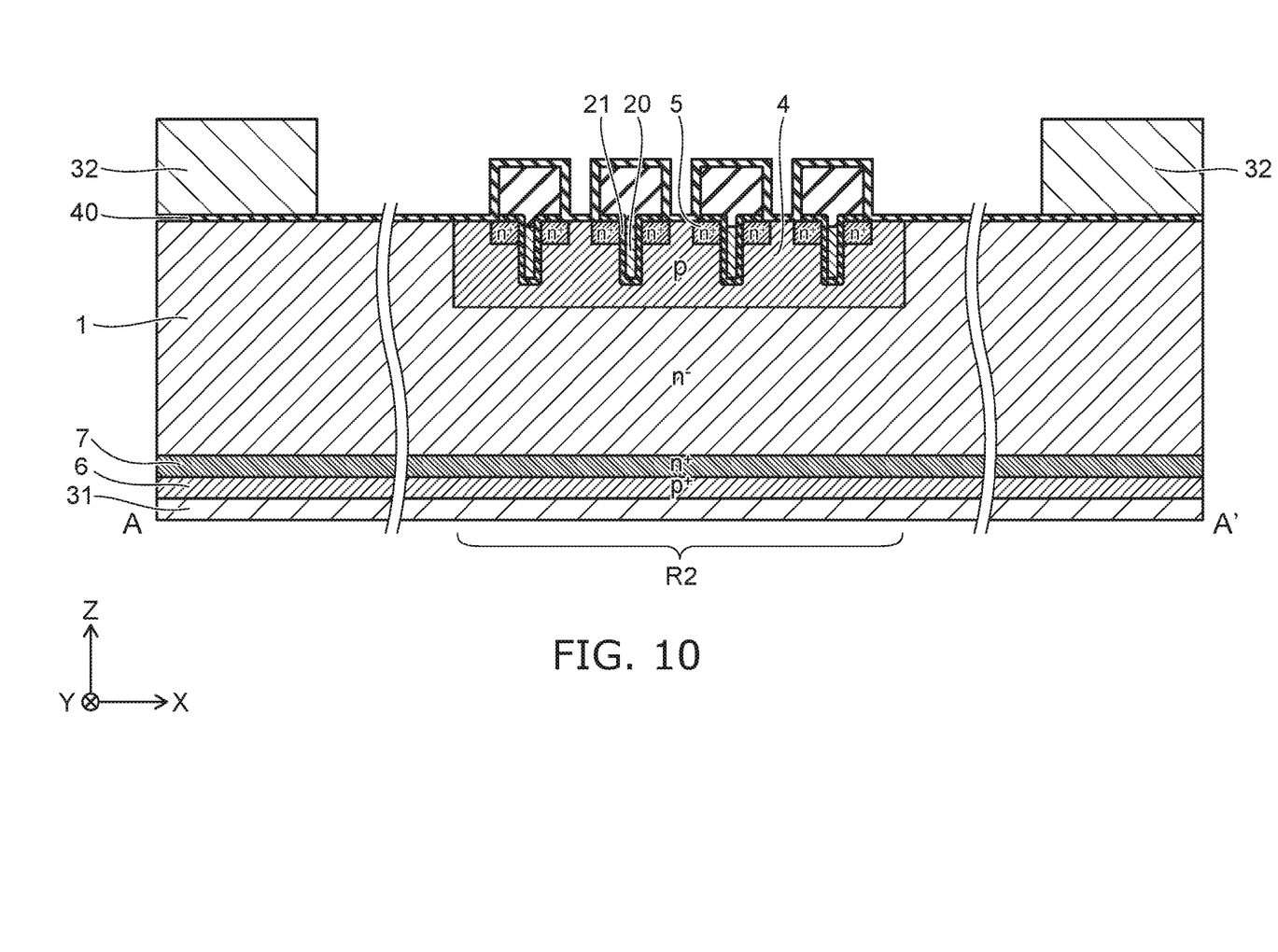
FIG. 10 is an A-A' cross-sectional view of FIG. 9.

FIG. 10 is an A-A' cross-sectional view of FIG. 9.

Figure 11:
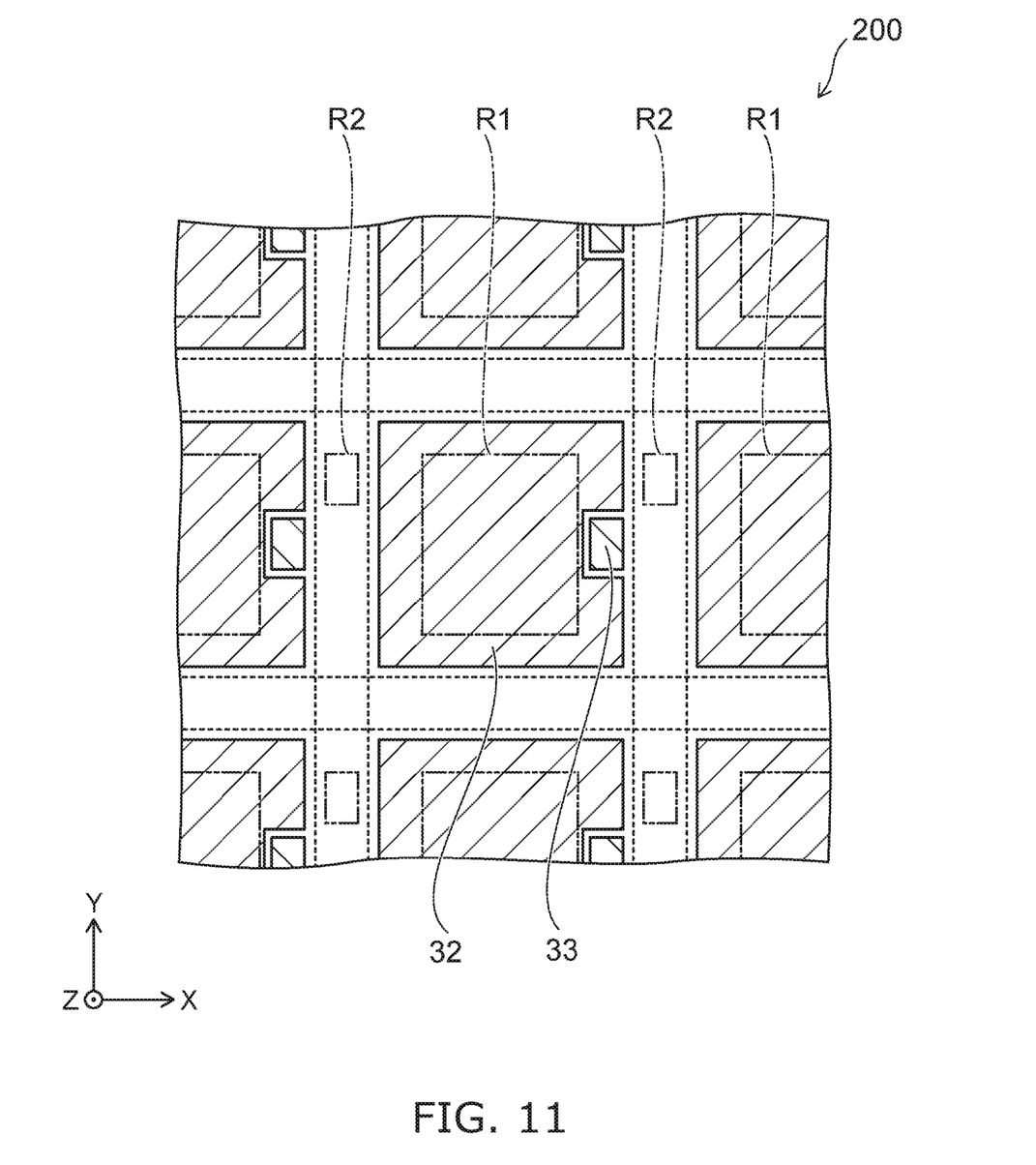
FIG. 11 is a process plan view showing a patterning process of the semiconductor substrate according to the second embodiment.

FIG. 11 is a process plan view showing a patterning process of the semiconductor substrate 200 according to the second embodiment.

The main element region R1 and the test element region R2 are illustrated by broken lines in FIG. 9.

As shown in FIG. 9 and FIG. 10, the semiconductor substrate 200 includes multiple main element regions R1 and test element regions R2. In the example shown in FIG. 9, the main element regions R1 and the test element regions R2 are provided alternately in the X-direction. The test element region R2 may be provided between the main element regions R1 adjacent to each other in the Y-direction.

In the semiconductor device 100 according to the first embodiment, a portion of the emitter electrode 32 is provided in the test element region R2. Conversely, in the embodiment, the test element region R2 is provided to be separated from the emitter electrode 32.

The semiconductor substrate 200 according to the embodiment can be made and tested similarly to the method for manufacturing the semiconductor device 100 shown in FIG. 3A to FIG. 5B. However, as shown in FIG. 9, compared to the semiconductor device 100, the test element region R2 is formed at a position separated further from the main element region R1.

For example, singulated semiconductor devices are obtained by dicing the semiconductor substrate 200 at the positions of the broken lines shown in FIG. 11. In such a case, the test element region R2 does not exist in the singulated semiconductor devices.

By using the semiconductor substrate according to the embodiment, the detection precision of the defects of the gate insulating layer 11 can be increased.

The semiconductor substrate according to the embodiment may include multiple test element regions similarly to the modification of the first embodiment.

Hereinabove, the invention according to the embodiments is described using an IGBT as an example. The invention according to the embodiments is not limited thereto and is applicable to a MOSFET as well. In such a case, for example, by omitting the p$^+$-type collector region 6 in the semiconductor device according to the embodiments described above, the n$^+$-type semiconductor region 7 can be used as a drain region; and the n$^+$-type emitter region 3 can function as a source region.

By applying the invention according to the embodiments described above to a MOSFET as well, the detection precision of the defects of the gate insulating layer 11 can be increased.

It is possible to confirm the relative levels of the impurity concentrations of the semiconductor regions in the embodiments described above, for example, using a SCM (scanning capacitance microscope). The carrier concentrations of the semiconductor regions may be considered to be equal to the activated impurity concentrations of the semiconductor regions. Accordingly, the relative levels of the carrier concentrations of the semiconductor regions can be confirmed using SCM. It is possible to measure the impurity concentrations of the semiconductor regions, for example, using a SIMS (secondary ion mass spectrometer).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. One skilled in the art can appropriately select specific configurations of components included in the embodiments, for example the p$^+$-type collector region 6, the n$^+$-type semiconductor region 7, the n$^-$-type semiconductor region 1, the p-type base region 2, the n$^+$-type emitter region 3, the gate electrode 10, the gate insulating layer 11, the collector electrode 31, the emitter electrode 32, and the gate electrode pad 33, etc., from known art. The accompanying claims and their equivalents are intended to cover such forms or modifications as would fall within the scope and spirit of the invention.

What is claimed is:

1. A semiconductor device, comprising:
a first semiconductor region of a first conductivity type;
a second semiconductor region of a second conductivity type provided selectively on the first semiconductor region;
a third semiconductor region of the first conductivity type provided selectively on the second semiconductor region;
a gate electrode arranged with the second semiconductor region in a second direction, the second direction being perpendicular to a first direction from the first semiconductor region toward the second semiconductor region;
a gate insulating layer provided between the gate electrode and the first semiconductor region, between the gate electrode and the second semiconductor region, and between the gate electrode and the third semiconductor region;
a fourth semiconductor region of the second conductivity type provided selectively on the first semiconductor region, the fourth semiconductor region being separated from the second semiconductor region;
a first conductive unit, at least a portion of the first conductive unit being surrounded with the fourth semiconductor region, wherein a length in the second direction of the first conductive unit is shorter than a length in the second direction of the gate electrode; and
a first insulating layer, at least a portion of the first insulating layer being provided between the first conductive unit and the fourth semiconductor region, a thickness of a portion of the first insulating layer positioned between the first conductive unit and the first semiconductor region in the first direction being thinner than a film thickness of the gate insulating layer.

2. The device according to claim 1, wherein dielectric breakdown of the first insulating layer has occurred.

3. The device according to claim 1, further comprising:
a second conductive unit separated from the first conductive unit, at least a portion of the second conductive unit being surrounded with the fourth semiconductor region; and
a second insulating layer, at least a portion of the second insulating layer being provided between the second conductive unit and the fourth semiconductor region, a thickness of a portion of the second insulating layer positioned between the second conductive unit and the first semiconductor region in the first direction being thinner than the film thickness of the gate insulating layer, the thickness of the portion of the second insulating layer being thicker than the thickness of the portion of the first insulating layer.

4. The device according to claim 3, wherein a length in the second direction of the second conductive unit is shorter than a length in the second direction of the gate electrode and longer than a length in the second direction of the first conductive unit.

5. The device according to claim 1, comprising:
a first electrode provided on the second semiconductor region, on the third semiconductor region, and on the fourth semiconductor region, the first electrode being electrically connected to the second semiconductor region and the third semiconductor region; and
an insulating layer provided between the first electrode and the fourth semiconductor region.

6. The device according to claim 1, wherein a length in the first direction of the fourth semiconductor region is longer than a length in the first direction of the second semiconductor region.

7. The device according to claim 1, wherein conduction occurs between the first conductive unit and the fourth semiconductor region.

8. The device according to claim 1, wherein conduction occurs between the first conductive unit and the first semiconductor region.

9. The device according to claim 1, further comprising a fifth semiconductor region of the first conductivity type provided selectively on the fourth semiconductor region, a carrier concentration of the first conductivity type of the fifth semiconductor region being higher than a carrier concentration of the first conductivity type of the first semiconductor region.

10. The device according to claim 1, further comprising a sixth semiconductor region of the second conductivity type provided under the first semiconductor region, an impurity concentration of the second conductivity type of the sixth semiconductor region being higher than an impurity concentration of the second conductivity type of the second semiconductor region.

11. The device according to claim 10, further comprising a seventh semiconductor region of the first conductivity type provided on the sixth semiconductor region and under the first semiconductor region, an impurity concentration of the first conductivity type of the seventh semiconductor region being higher than an impurity concentration of the first conductivity type of the first semiconductor region.

12. The device according to claim 1, further comprising an eighth semiconductor region of the second conductivity type provided on the first semiconductor region, the eighth semiconductor region being provided to be separated from the fourth semiconductor region, a length in the first direction of the eighth semiconductor region being longer than a length in the first direction of the second semiconductor region, a portion of the eighth semiconductor region being positioned between the second semiconductor region and the fourth semiconductor region in the second direction.

13. The device according to claim 1, wherein a depth of the fourth semiconductor region is more than a depth of the second semiconductor region.

14. The device according to claim 1, a bottom of the first conductive unit is surrounded with the fourth semiconductor region.

* * * * *